United States Patent [19]

Brambilla

[11] 4,182,997
[45] Jan. 8, 1980

[54] BAND-PASS/BAND-STOP FILTER FOR TELECOMMUNICATION SYSTEM

[75] Inventor: Giuliano Brambilla, Milan, Italy

[73] Assignee: Societe Italiana Telecomunicazioni Siemens S.p.A., Milan, Italy

[21] Appl. No.: 860,835

[22] Filed: Dec. 15, 1977

[30] Foreign Application Priority Data

Dec. 16, 1976 [IT] Italy ..................... 30456 A/76

[51] Int. Cl.² ............... H03H 7/10; H03H 7/16; H01P 7/06

[52] U.S. Cl. ..................... 333/175; 333/176; 333/202; 333/209; 333/174

[58] Field of Search ............... 333/70 R, 73 W, 76, 333/82 R, 174–176, 177–180, 185, 202, 209, 210, 212; 334/65–72, 74–76

[56] References Cited

U.S. PATENT DOCUMENTS

| | | | |
|---|---|---|---|
| 2,131,976 | 10/1938 | Schaper | 334/65 |
| 2,969,460 | 1/1961 | Rowley | 334/72 |
| 3,293,644 | 12/1966 | Loos et al. | 333/73 R |
| 3,733,608 | 5/1973 | McGhay et al. | 333/73 R |

*Primary Examiner*—Alfred E. Smith
*Assistant Examiner*—Marvin Nussbaum

*Attorney, Agent, or Firm*—Karl F. Ross

[57] ABSTRACT

A filter for a telecommunication system, designed to suppress a signal frequency $F_a$ and to transmit an adjoining frequency $F_b$ without significant attenuation, comprises a resonant cavity of prismatic shape longitudinally traversed by a conductive coil wound on a hollow dielectric core into which an adjusting screw is inserted. One end of the coil is grounded at the cavity wall while its other end is left unconnected and forms with the adjusting screw a variable capacitance $C_d$ with distributed constants; a lumped-constant tuning capacitor $C_1$ is connected between ground and an input lead connected to an intermediate tap on the coil, the inductance $L_2''$ of that lead and the inductance $L_2'$ of the coil portion between the tap and ground forming an inductive voltage divider bridged by the lumped-constant capacitor $C_1$. The remainder of the coil, lying between the tap and the unconnected end, forms an inductance $L_1$ which together with the distributed-constant capacitance $C_d$ shunts the portion $L_2'$ of the inductive divider and forms a series-resonant circuit tuned to frequency $F_a$; the combination of voltage divider $L_2'$, $L_2''$ and lumped-constant capacitor $C_1$ constitutes a parallel-resonant circuit tuned to frequency $F_b$.

10 Claims, 3 Drawing Figures

BAND-PASS/BAND-STOP FILTER FOR TELECOMMUNICATION SYSTEM

FIELD OF THE INVENTION

My present invention relates to a filter of the band-pass/band-stop type as used, for example, in a duplexer of a telecommunication system.

BACKGROUND OF THE INVENTION

In a transmit/receive unit of such a telecommunication system it is often necessary to provide a duplexing filter blocking a first signal frequency $F_a$, e.g. that of an outgoing carrier, and to pass without significant attenuation a second, closely adjoining signal frequency $F_b$, such as that of an incoming carrier. Filters of this type must be highly selective to eliminate possible interferences between the two signal channels; they should also introduce as small an insertion loss as possible.

Filters conventionally used for this purpose, especially in the microwave range, include coaxial series-resonant and parallel-resonant cavities. Such structures have good electrical characteristics but are relatively bulky and require a high degree of precision in their manufacture, which makes them expensive to produce.

Less costly combinations of lumped-constant band-pass and band-stop filters are satisfactory only for relatively large frequency differences $F_a - F_b$.

OBJECTS OF THE INVENTION

Thus, the general object of my present invention is to provide a filter of the type referred to which operates with low insertion loss and effectively discriminates between closely adjoining frequencies.

A more particular object is to provide simple means in such a filter for adjusting its pass and stop bands, possibly with a reversal of the relative positions thereof.

SUMMARY OF THE INVENTION

In accordance with my present invention, an input lead is connected to an intermediate tap of a conductive coil wound on a hollow dielectric core, the coil ending in a grounded first terminal and an unconnected second terminal. A conductive rod extending partly into the core, in the vicinity of the first coil terminal, constitutes with one portion of the coil a distributed-constant capacitance $C_d$ while another coil portion is bridged by a preferably adjustable lumped-constant capacitor $C_1$ connected between ground and the input lead. The first-mentioned coil portion has an inductance $L_1$ lying effectively in series with capacitance $C_d$ while the inductance $L_2'$ of the second coil portion, possibly supplemented by an inductance $L_2''$ of the input lead itself, lies in parallel with the capacitor $C_1$. The parallel-resonant circuit including this capacitor and inductance $L_2'$ is tuned to the frequency $F_b$ to be passed whereas the series-resonant circuit $L_1$, $C_d$ is tuned to the frequency $F_a$ to be suppressed.

Both resonant circuits can be tunable by an adjustment of their respective capacitances. The tuning of the distributed-constant capacitance $C_d$, in particular, may be effected by axially shifting the inserted rod which for this purpose is advantageously designed as a screw.

In order to increase the Q-factor and therefore the selectivity of the filter, in the case of microwave frequencies, I prefer to enclose the coil in a resonant cavity whose distributed reactances supplement those of the elements referred to. The lumped capacitor $C_1$ is advantageously lodged within that cavity in order to shield it from stray external capacitances.

BRIEF DESCRIPTION OF THE DRAWING

The above and other features of my invention will now be described in detail with reference to the accompanying drawing in which.

SPECIFIC DESCRIPTION

Figure 1:
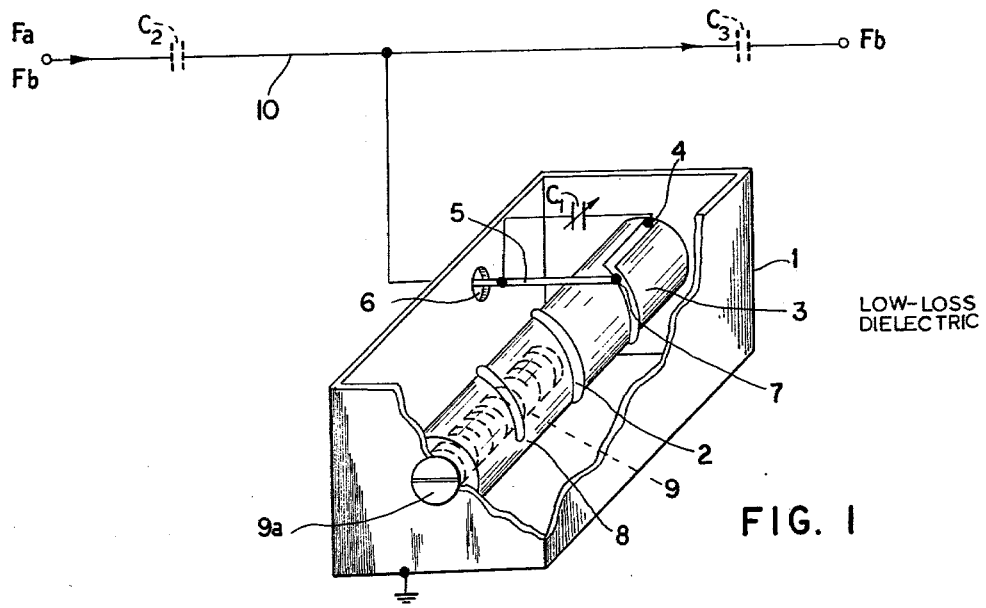
FIG. 1 is a somewhat diagrammatic view of a resonant cavity (parts broken away) accommodating a filter according to my invention.

In FIG. 1 I have shown a signal path in the form of a transmission line 10 designed to convey only a frequency $F_b$ while suppressing a frequency $F_a$ present at a point of origin. For this purpose a branch lead 5 extends through an aperture 6 of an otherwise closed conductive housing 1, forming a resonant cavity, into contact with a conductive coil 2 to which it is joined at an intermediate tap 7. Housing 1 is of elongate prismatic configuration, with a rectangular cross-section, and is longitudinally traversed by a tubular core 3 of low-loss dielectric material on which the coil 2 is wound. One end 4 of this coil is grounded at the cavity wall while its opposite end 8 is left unconnected.

The interior of core 3 is accessible through one end wall of housng 1 for the insertion of a screw 9 with slotted head 9a; screw 9, threadedly engaging in the bore of core 3, penetrates into that core to an adjustable extent in the region between tap 7 and coil terminal 8. A lumped capacitor $C_1$ is connected between input lead 5 and ground, i.e. the terminal 4 of coil 2. Capacitor $C_1$, disposed inside housing 1, is also shown to be adjustable.

Two further capacitors $C_2$ and $C_3$ are shown to be serially inserted in line 10, upcircuit and downcircuit of its junction with lead 5.

Figure 2:
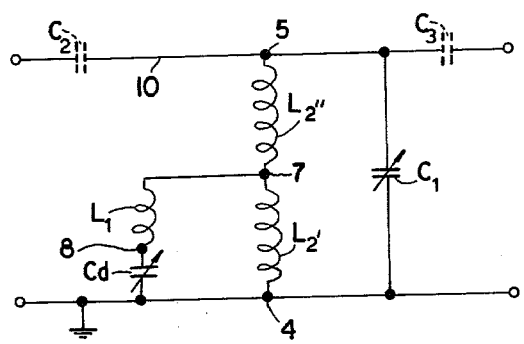
FIG. 2 is an equivalent-circuit diagram of the filter of FIG. 1.

FIG. 2 shows the equivalent circuit of the physical arrangement illustrated in FIG. 1. Thus, the portion of coil 2 lying between tap 7 and terminal 8 is represented by an inductance $L_1$ in series with a capacitance $C_d$ existing mainly between that coil portion and the screw 9 but encompassing also such other capacitances as that between this coil portion and the walls of housing 1. The other coil portion, lying between tap 7 and terminal 4, has an inductance $L_2'$ in series with an inductance $L_2''$ representing the part of lead 5 lying between tap 7 and its junction with capacitor $C_1$. It will be noted that the two inductances $L_2'$ and $L_2''$ constitute an inductive voltage divider between transmission line 10 and ground. The voltage divider $L_2'$, $L_2''$ is bridged by the capacitor $C_1$ to form therewith a parallel-resonant circuit tuned to the pass frequency $F_b$, this being the resonant frequency of the cavity without capacitors $C_2$ and $C_3$.

On the other hand, the series-resonant circuit constitutes by inductance $L_1$ and capacitance $C_d$ is tuned to the frequency $F_a$ to be eliminated from the signal path 10.

Figure 3:
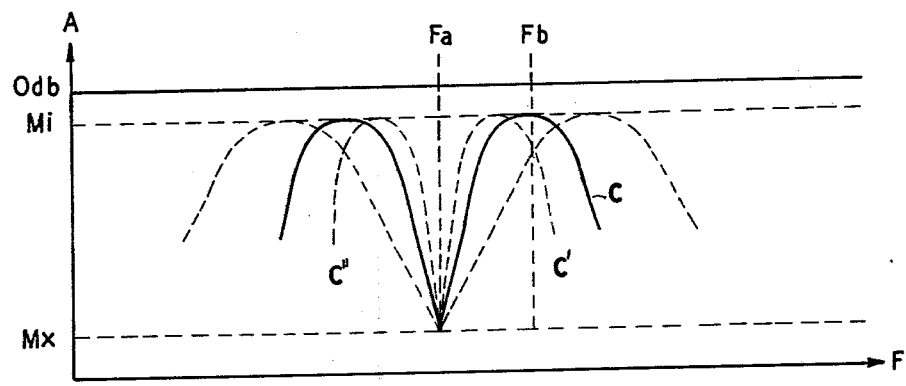
FIG. 3 is a set of curves showing the response of the filter.

In FIG. 3 I have shown the attenuation A of my improved filter plotted against frequency F, with an abscissa axis Odb representing zero attenuation. A line Mi denotes the minimum attenuation to be undergone by the pass frequency $F_b$ whereas a line Mx marks the maximum attenuation to which the stop frequency $F_a$ is to be subjected. With the use of a high-Q capacitor $C_1$ (Q>1500) and suitable choice of inductance $L_2''$ (effective length of lead 5 within the cavity) as well as input and output capacitances $C_2$, $C_3$, if any, the attenuation Mx may reach a value of 30 to 40 db. The minimum attenuation Mi may be 1 db or less, depending on the separation of frequencies $F_a$ and $F_b$.

The solid-line curve C of FIG. 3 has two peaks of minimum attenuation at opposite sides of frequency $F_a$ to which the series-resonant circuit $L_1$, $C_d$ is tuned, one of these peaks coinciding with frequency $F_b$. Two other curves C' and C" show a shifting of the peaks toward the higher or the lower frequencies upon an adjustment of capacitor $C_1$ to a respective limiting value. This adjustability is particularly useful in a duplexer of a telecommunication system since it allows use of one and the same filter with changes in the separation and possibly also in the relative position of the frequencies of incoming and outgoing carrier waves. The filter coil 2 shown in FIG. 1 may consist of a simple metal wire soldered to lead 5 and housing 1 at tap 7 and terminal 4. However, as described and claimed in commonly owned application Ser. No. 860,836 filed Dec. 15, 1977 by Franco Papa, such a coil could also be made from a sheet-metal strip split at tap 7 into a branch lead 5 and an extremity integral with a transverse tab which is grounded by its contact with the cavity wall.

I claim:

1. A band-pass/band-stop filter adapted to suppress a first signal frequency $F_a$ and to pass without significant attenuation a second signal frequency $F_b$, comprising:
    a conductive coil wound on a hollow dielectric core, said coil having a grounded first end and an unconnected second end;
    an input lead connected to said coil at a tap between said ends, said tap defining with said first end a grounded coil portion constituting a first inductance and with said second end an ungrounded coil portion constituting a second inductance;
    a conductive rod extending partly into said core in the vicinity of said first end and forming a distributed-constant capacitance with said ungrounded coil portion, said distributed-constant capacitance and said first inductance together constituting a series-resonant circuit tuned to said first frequency $F_a$; and
    a lumped-constant capacitor connected between said input lead and ground, said lumped-constant capacitor and said second inductance forming part of a parallel-resonant circuit tuned to said second frequency $F_b$.

2. A filter as defined in claim 1 wherein said parallel-resonant circuit includes an inductance formed by a part of said input lead.

3. A filter as defined in claim 1 wherein said rod is axially displaceable in said core for varying said distributed-constant capacitance.

4. A filter as defined in claim 3 wherein said rod is a screw threaded into said core.

5. A filter as defined in claim 1, further comprising a resonant cavity enclosing said coil.

6. A filter as defined in claim 5 wherein said resonant cavity is formed by an elongate conductive housing, said coil extending longitudinally of said housing.

7. A filter as defined in claim 6 wherein said housing is prismatic with a rectangular cross-section.

8. A filter as defined in claim 5 wherein said lumped-constant capacitor is disposed inside said resonant cavity.

9. A filter as defined in claim 1 wherein said lumped-constant capacitor is adjustable.

10. A filter as defined in claim 1 wherein said input lead is connected to a junction of two further capacitors serially connected in a signal path.

* * * * *